(12) United States Patent
Rantala

(10) Patent No.: US 6,501,126 B1
(45) Date of Patent: Dec. 31, 2002

(54) SEMICONDUCTOR STRUCTURE AND PROCEDURE FOR MINIMIZING NON-IDEALITIES

(75) Inventor: Arto Rantala, Espoo (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 0 days.

(21) Appl. No.: 09/719,133
(22) PCT Filed: Jun. 8, 1999
(86) PCT No.: PCT/FI99/00494
§ 371 (c)(1),
(2), (4) Date: Feb. 15, 2001
(87) PCT Pub. No.: WO99/67827
PCT Pub. Date: Dec. 29, 1999

(30) Foreign Application Priority Data

Jun. 8, 1998 (FI) .................................................. 981301

(51) Int. Cl.⁷ .............................................. H01L 27/76
(52) U.S. Cl. ....................... 257/319; 257/314; 257/315; 257/316
(58) Field of Search ................................. 257/314, 315, 257/321, 372, 326, 322, 316, 317, 318, 319; 438/201, 211, 257, 260, 266

(56) References Cited

U.S. PATENT DOCUMENTS 5,294,819 A    3/1994    Simko
5,587,668 A    12/1996   Shibata et al.
5,998,842 A  * 12/1999   Sano
6,008,508 A  * 12/1999   Bergemont et al.
6,034,894 A  *  3/2000   Maruyama et al.

FOREIGN PATENT DOCUMENTS

EP            037 201     10/1981

OTHER PUBLICATIONS

Frederick Mish (editor), Merrian-Webster's Collegiate Dictionary, 1999, Merriam-Webster, Incorporated, tenth edition, p. 1182.*

* cited by examiner

Primary Examiner—Nathan J. Flynn
Assistant Examiner—Kevin Qunito
(74) Attorney, Agent, or Firm—Andrus, Sceales, Starke & Sawall, LLP

(57) ABSTRACT

The invention relates to a semiconductor structure and a method for minimizing non-idealities in a semiconductor structure, in which a drain; a source, a floating gate (102) and at least one input (108) capacitively connected'to the floating gate (102) are disposed on a substrate (105) so as to form a v-MOSFET transistor. According to the invention, a conductive layer insulated from the floating gate (102) and at least partially superimposed on the gate (102) is formed in the semiconductor structure and the conductive layer is connected to a constant potential.

23 Claims, 8 Drawing Sheets

SEMICONDUCTOR STRUCTURE AND PROCEDURE FOR MINIMIZING NON-IDEALITIES

CROSS REFERENCE TO RELATED APPLICATION

The present application is the U.S. national stage application of International Application PCT/FI99/00494, filed Jun. 8, 1999, which international application was published on Dec. 29, 1999 as International Publication WO 99/67827 in the English language. The International Application claims the priority of Finnish Patent Application 981301, filed Jun. 8, 1998.

The present invention relates to micro-electronics. In particular, the invention concerns a semiconductor structure and a method for minimising non-idealities in semiconductors.

BACKGROUND OF THE INVENTION

In the prior art, a semiconductor structure is known in which one or more inputs are capacitively connected to the gate of a MOSFET transistor (Metal Oxide Semiconductor Field Effect Transistor). In the present publication, components thus formed are referred to with the designation v-MOSFET. These components can be connected together to form more complex assemblies. FIG. 1 presents the circuit diagram and a cross-sectional view of a possible implementation.

The basic idea of the v-MOSFET transistor is that the input voltages are summed at the gate of the transistor in accordance with capacitive weighting co-efficients. The voltage summed at the gate is given by the equation.

$$\phi_F = \frac{\sum_{i=1}^{n} C_i V_i}{\sum_{i=1}^{n} C_i}$$

where is the voltage at the floating gate, $C_i$ is the weighting coefficient (capacitance) of input i and $V_i$ is the voltage at input i. By using different combinations of weighting coefficients and inputs, it is possible to implement many functions, such as electric neurons or A/D and D/A converters.

In the V-MOSFET structures presented, a problem is that there are variations and non-idealities in the semiconductor manufacturing process. In addition to the designed inputs, the capacitive coupling between the gate and the substrate causes distortion of the summing.

Figure 2:
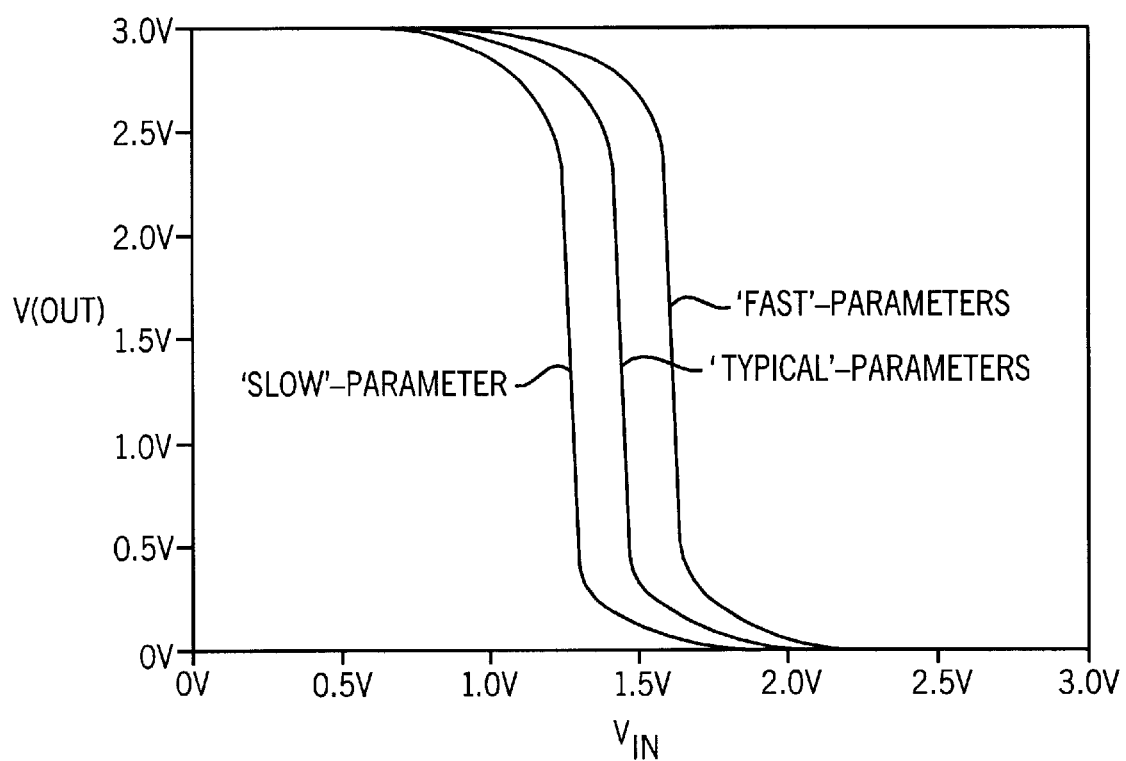

In the manufacturing process of semiconductor circuits, certain parameters change from one process run to the next, e.g. when there are variations in the alignment of manufacturing masks or in layer thickness. The properties of complex components, such as transistors, are determined by the combined effect of several parameters. Thus, for instance, the threshold voltage of a transistor may vary by as much as ten per cent. FIG. 2 illustrates simulation of the effects of process variations on the threshold voltage of a transistor. In the design of complex v-MOSFET structures, it would be desirable to be able to increase the number of inputs to provide as many inputs as possible. Process variations can be reduced by developing the process itself or by lowering the tolerances permitted in the process, but this leads to increased manufacturing costs. It would also preclude the use of known advantageous manufacturing processes.

The object of the present invention is to eliminate or at least to significantly reduce the problems described above. A further object of the invention is to disclose a new type of semiconductor structure and a method by which non-idealities due to variations in the IC process as well as internal non-idealities in semiconductors can be minimised by electric means.

BRIEF DESCRIPTION OF THE INVENTION

The invention concerns a method for minimising non-idealities in a semiconductor structure in which a drain, a source, a floating gate and at least one input are disposed on a substrate, the input being capacitively connected to the floating gate. Said semiconductor structure is preferably a v-MOSFET transistor. According to the invention, a conductive layer insulated from the floating gate and at least partially superimposed on the gate is formed in the semiconductor structure. The conductive layer is connected to a constant potential suitably selected, allowing non-idealities of the semiconductor structure to be minimised.

In a preferred embodiment of the invention, an eliminating grid at least partially covering the floating gate is formed from the conductive layer. In this case, the constant potential can be used to eliminate the parasitic substrate capacitance of the floating gate.

In a preferred embodiment of the invention, a control grid of the same material with the input is formed from the conductive layer. The control grid is capacitively connected to the floating gate, in a manner corresponding to the input connection. The control grid is preferably formed in the same layer with the input.

In a preferred embodiment of the invention, a basin located at least partially under the floating gate is formed from the conductive layer.

In a preferred embodiment of the invention, the conductive layer according to the above-described methods is divided into at least two sections so that the potentials of different sections can be controlled independently of each other. The sections can be controlled digitally. The proportions of the sections can also be distributed with a binary weighting.

Moreover, the invention concerns a semiconductor structure comprising a substrate with a drain, source, floating gate and at least one input disposed on it, the input being capacitively connected to the floating gate. According to the invention, the semiconductor structure comprises a conductive layer insulated from the floating gate and at least partially superimposed on the gate. In addition, the conductive layer is connected to a constant potential.

A semiconductor structure according to the invention comprises an eliminating grid formed from the semiconductor structure and at least partially extending over the floating gate.

A semiconductor structure according to the invention comprises a control grid formed from the conductive layer and made of the same material with the input, said control grid being capacitively connected to the floating gate. The control grid is preferably formed in the same layer with the input.

A semiconductor structure according to the invention comprises a basin formed from the conductive layer and disposed at least partially under the floating gate.

In certain embodiments, the semiconductor structures described above are implemented by dividing the conductive layer into at least two sections, allowing the potentials in different sections to be controlled independently of each other. In a preferred case, different sections are provided with digital control. The proportions of the sections can also be distributed with a binary weighting.

The semiconductor structure of the invention can be applied in various implementations, such as A/D converters, digital logic gates, neural network connections, D/A converters or comparators, in which the offset can be electrically corrected.

LIST OF ILLUSTRATIONS

Figure 1A:
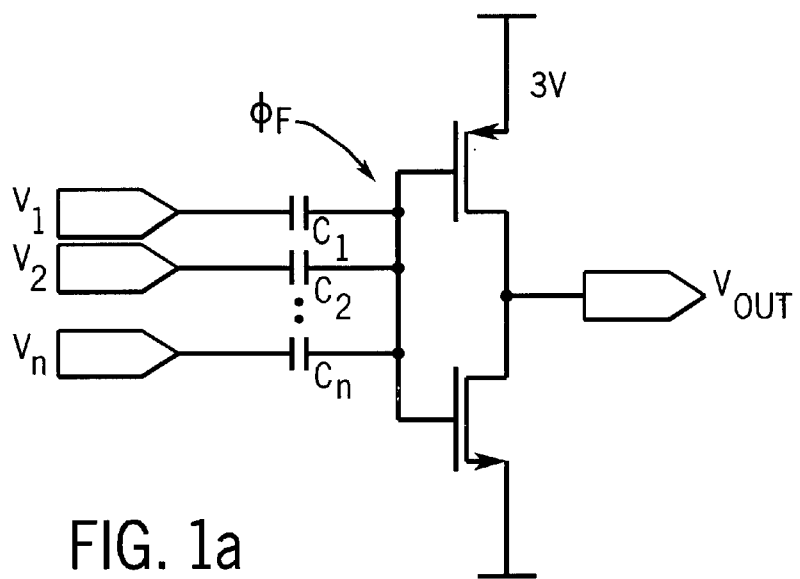
Figure 1B:
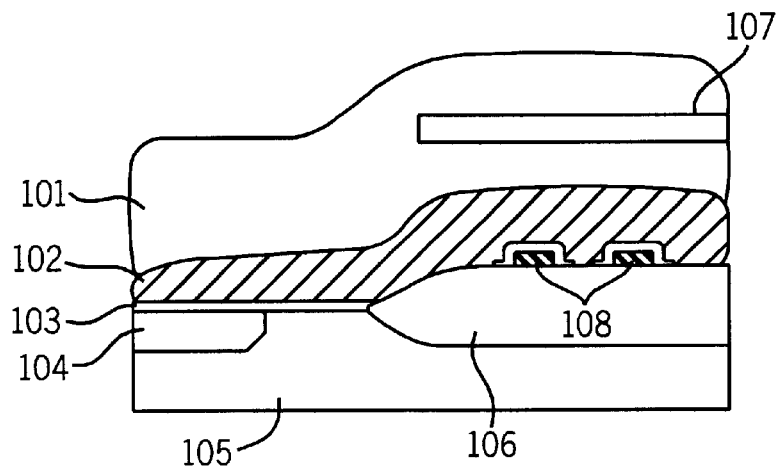
Figure 1C:
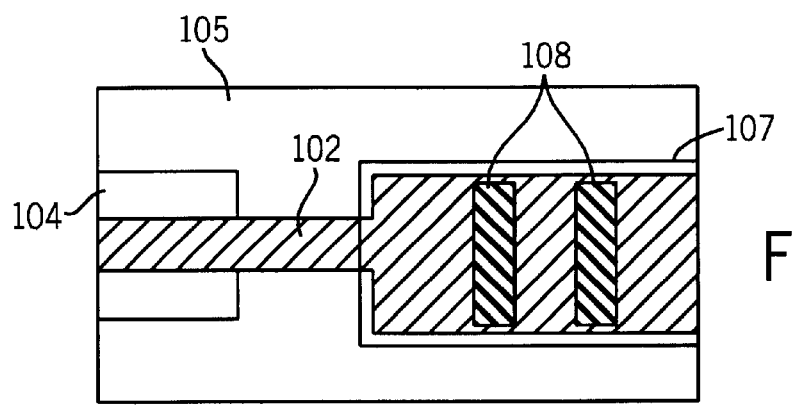
Figure 3A:
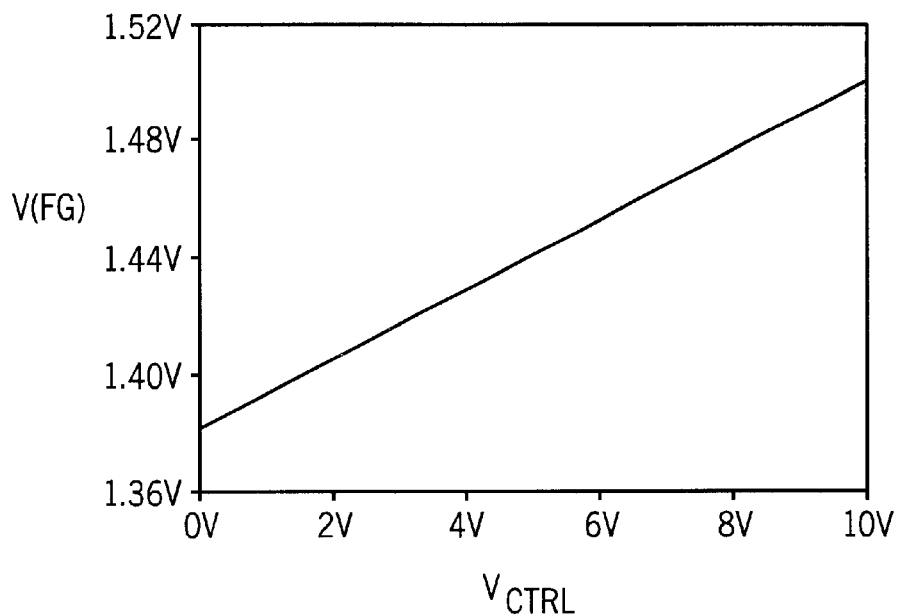
Figure 3B:
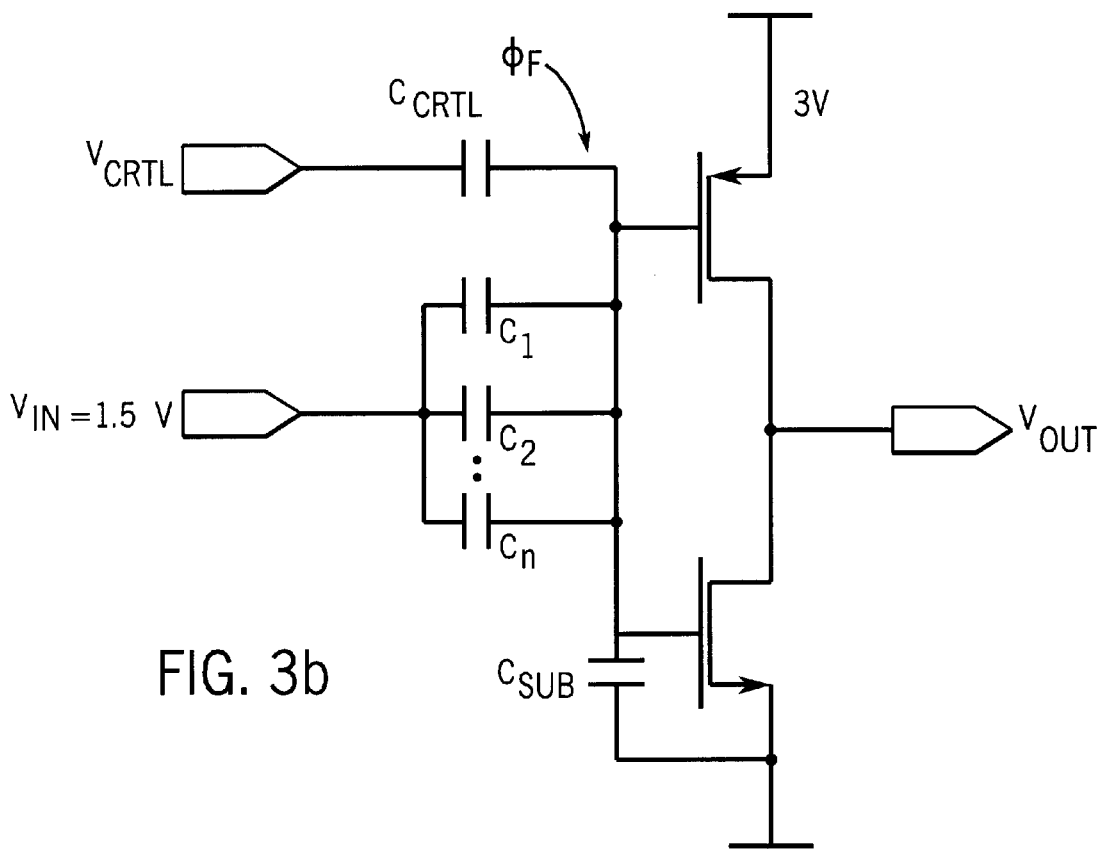
Figure 4A:
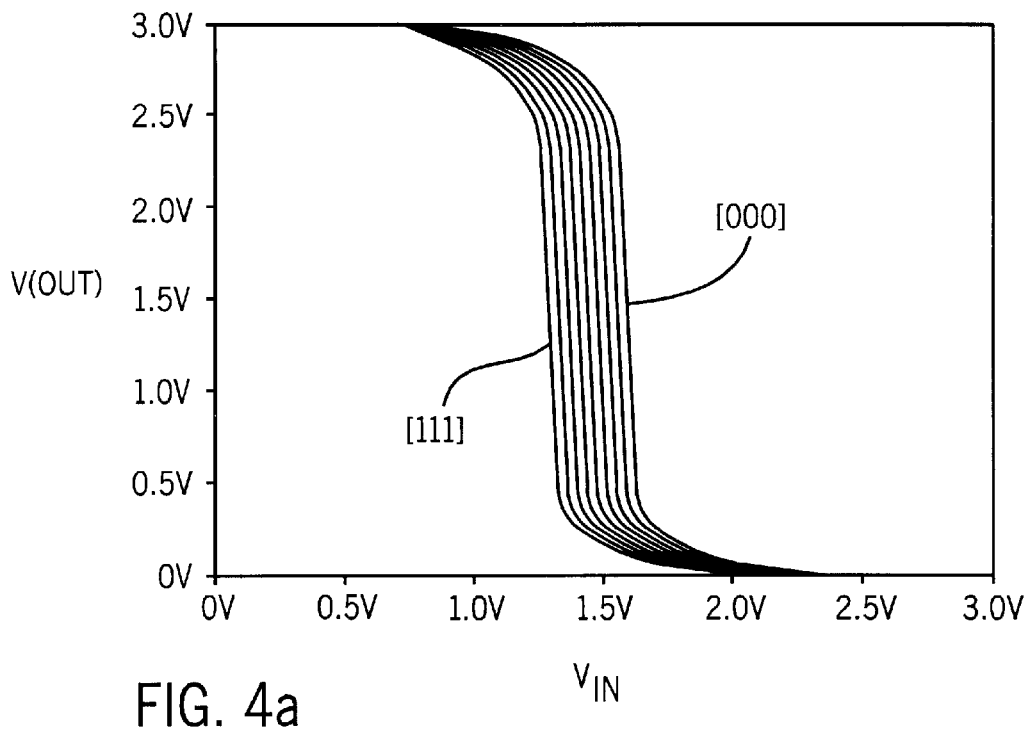
Figure 4B:
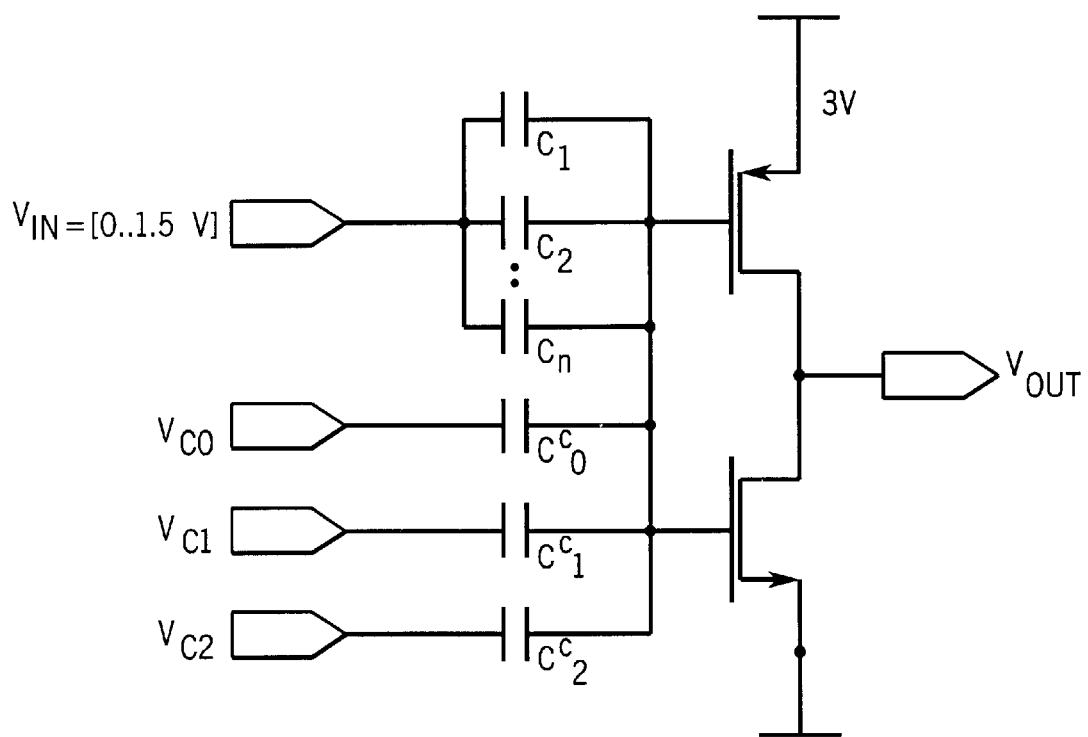
Figure 5A:
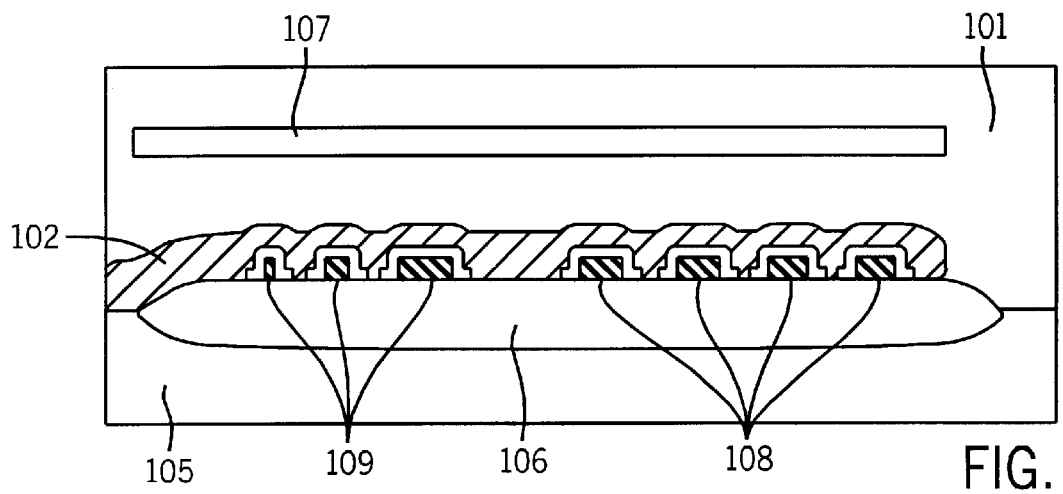
Figure 5B:
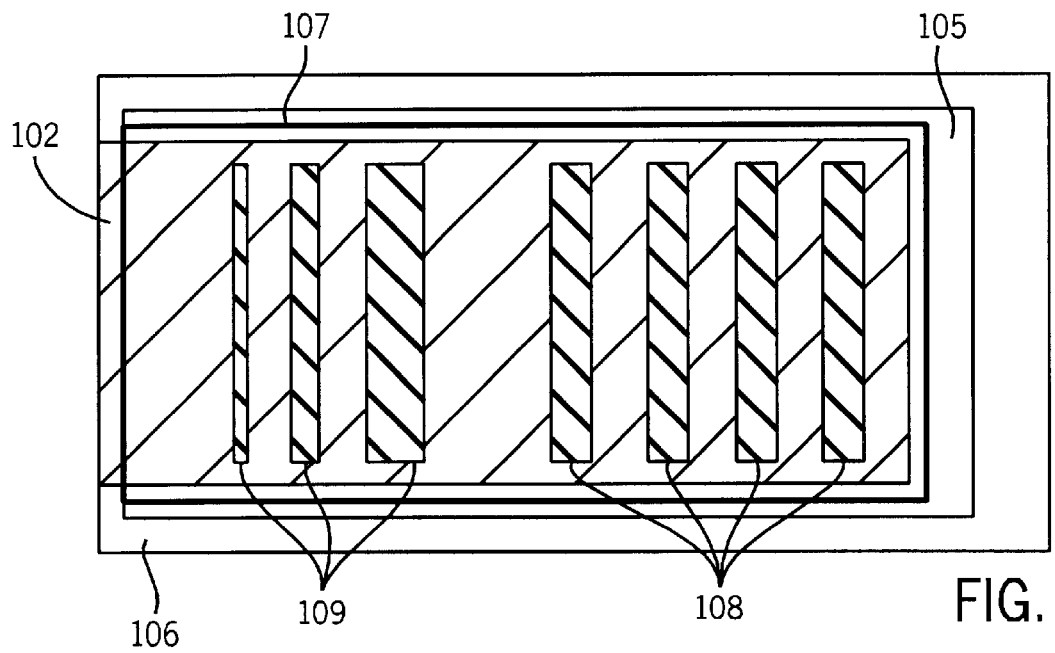
Figure 6:
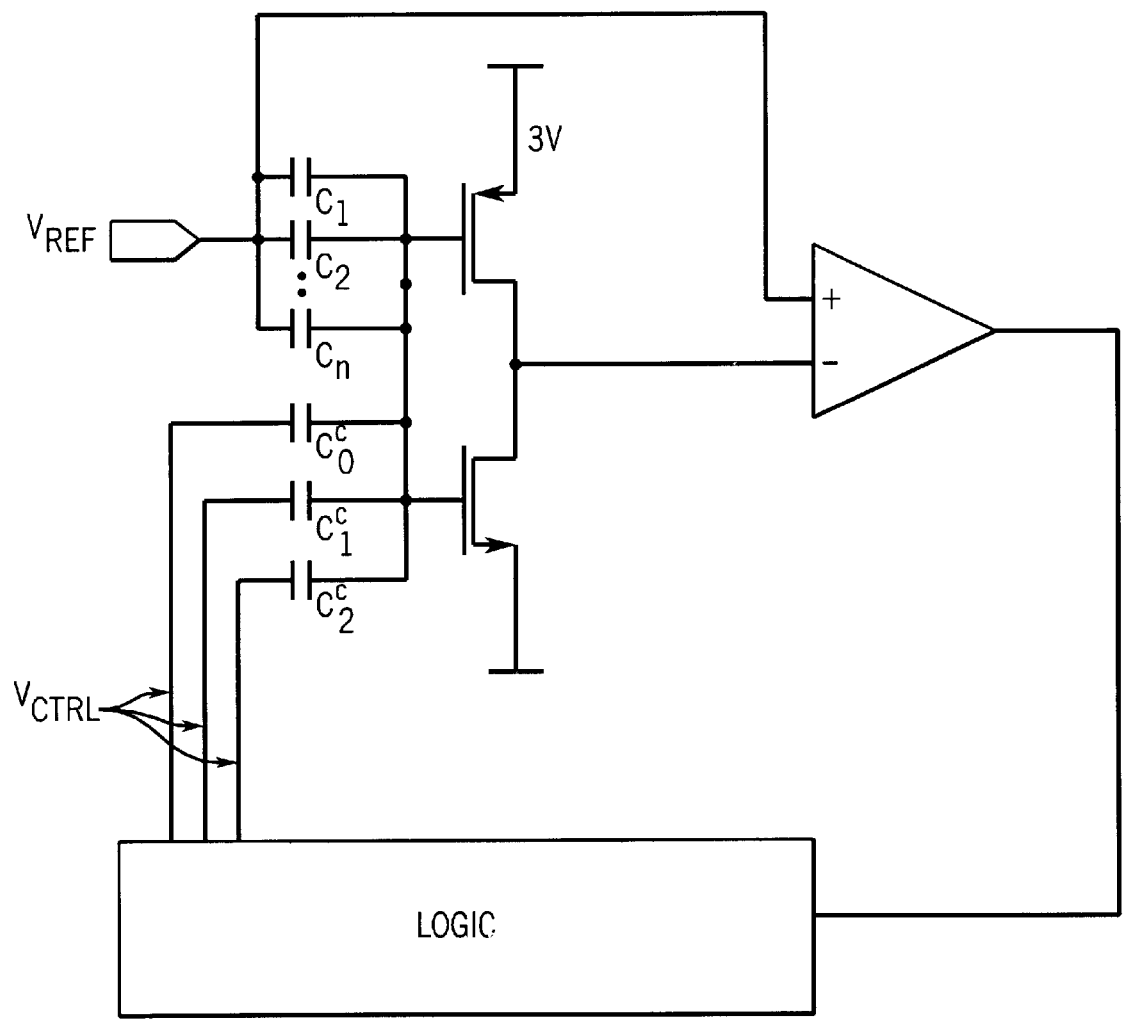
Figure 7A:
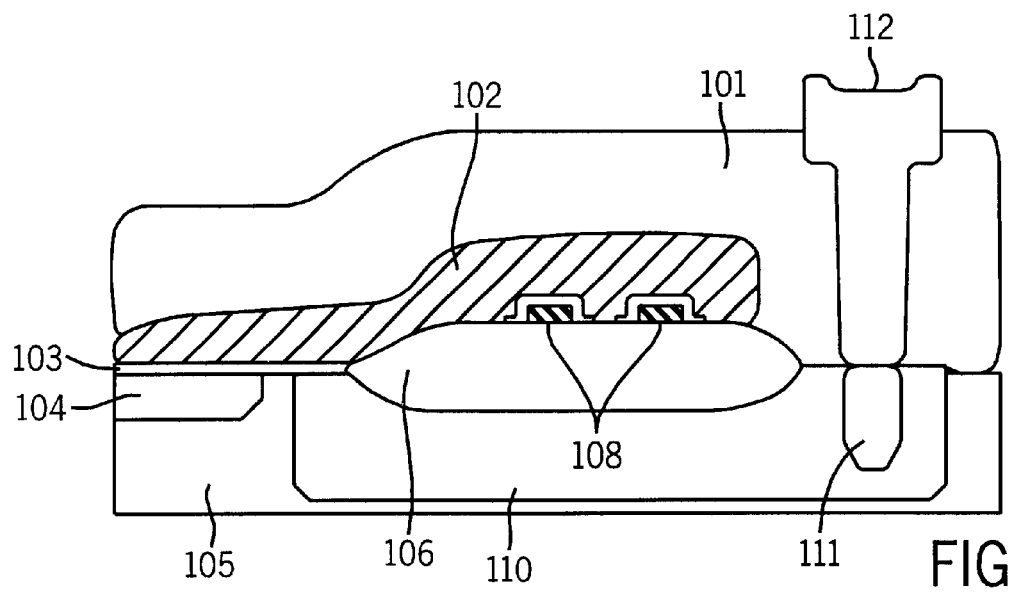
Figure 7B:
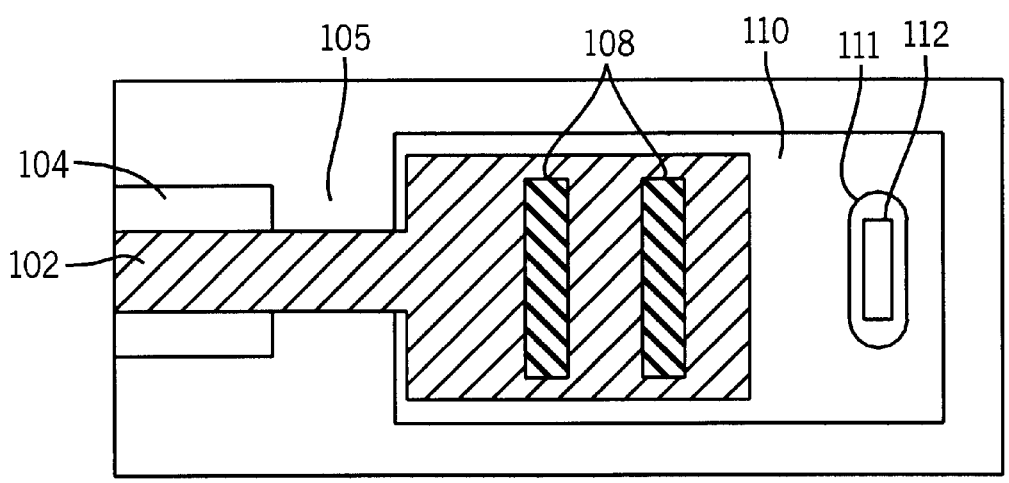
Figure 8A:
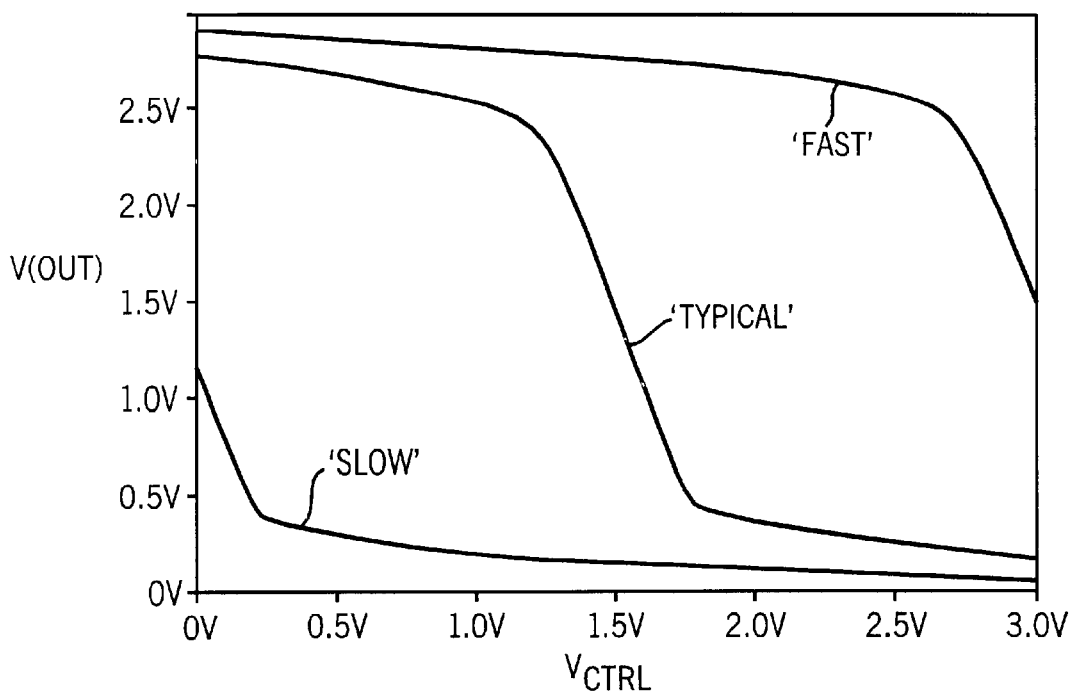
Figure 8B:
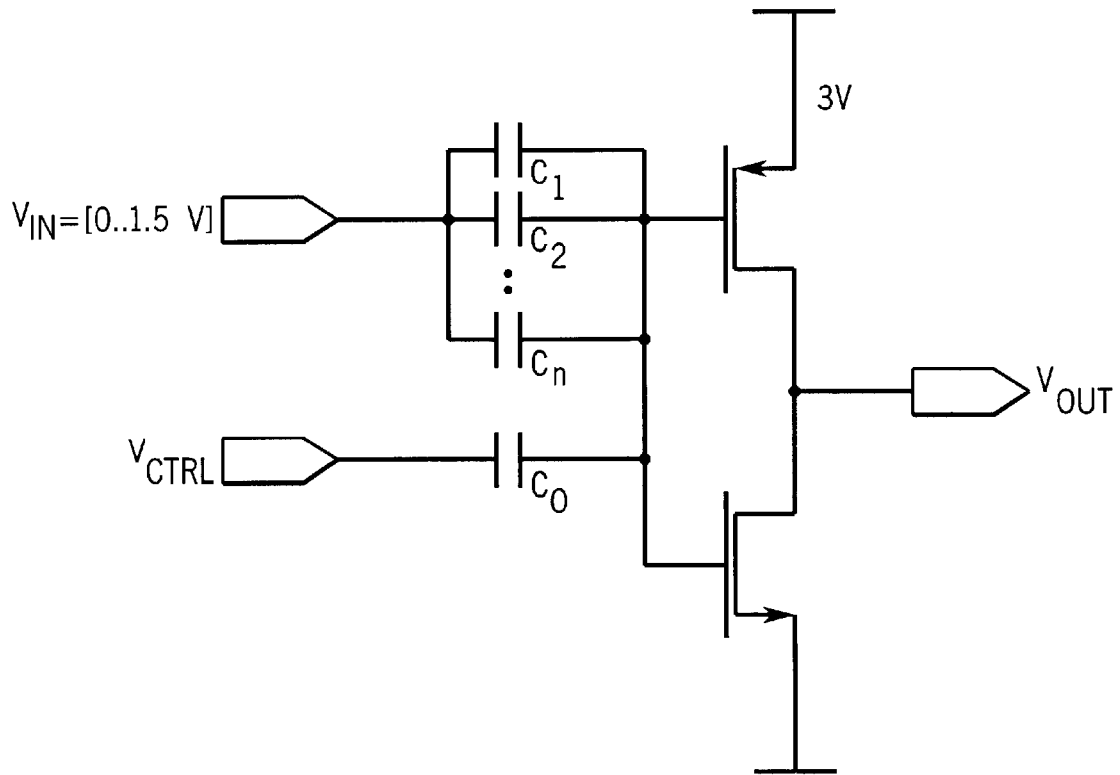

In the following, the invention will be described by the aid of a few examples of its embodiments with reference to the attached drawing, in which FIG. 1a presents an example of a circuit diagram for a v-MOSFET transistor;

FIG. 1b presents a sectional side view of a v-MOSFET transistor provided with an eliminating grid;

FIG. 1c presents a sectional top view of a v-MOSFET transistor provided with an eliminating grid;

FIG. 2 presents the DC transfer function of a simulated inverter with different transistor parameters;

FIG. 3a presents an example representing the simulated potential of the floating gate of a v-MOSFET transistor as a function of the voltage of the eliminating grid;

FIG. 3b presents the circuit used in the simulation;

FIG. 4a presents the DC transfer function of a simulated inverter when the states of the control grids are varied;

FIG. 4b presents the circuit used in the simulation;

FIG. 5a presents a sectional side view of another V-MOSFET structure comprising control grids;

FIG. 5b presents a sectional top view of a v-MOSFET structure comprising control grids;

FIG. 6 presents a diagram representing a circuit for generating control grid voltages;

FIG. 7a presents a sectional side view of a V-MOSFET structure comprising a conductive layer below the floating gate;

FIG. 7b presents a sectional top view of a v-MOSFET comprising a conductive layer below the floating gate;

FIG. 8a presents the DC transfer function of a simulated inverter when the states of the control grids are varied; and FIG. 8b presents the circuit used in the simulation.

DETAILED DESCRIPTION OF THE INVENTION

FIG. 1b shows a side view and FIG. 1c a top view of a semiconductor structure according to the invention, presented by way of example. It is to be noted that the dimensions shown in the figures are only one example of an implementation according to the present invention.

The semiconductor structure is implemented on a substrate 105. The substrate usually consists of single-crystal silicon. The v-MOSFET transistor comprises an active region 104 and a floating gate 102, which has been formed from a second polysilicon layer. Polysilicon can also be replaced with some other conductive material applicable. The transistor may be an enhancement-type or a depletion-type transistor. Gate insulation 103 is provided between the active region 104 and the gate 102. The floating gate 102 is controlled by control grids 108, which have been formed from the lower polysilicon layer and insulated from the upper polysilicon layer by using e.g. nitride in the manufacturing process. The control grids 108 are insulated from the substrate 105 by a dielectric layer 106 of field oxide. Between the polysilicon layers and the metal layer formed on top of them there is a protecting dielectric layer 101 of silicon dioxide.

Elimination of parasitic substrate capacitance can be implemented by processing e.g. a metallic conductor layer onto the floating gate 102 and forming an eliminating grid 107 from this layer. The eliminating grid 107 can also be disposed below the floating gate 102. The eliminating grid is insulated from the floating gate by an insulating layer 101. According to the invention, a constant potential is applied to the eliminating grid 107.

FIG. 3 illustrates a simulation arrangement in which the voltage of the eliminating grid 107 is varied while at the same time applying a constant voltage, e.g. $VDD/2$, to the main inputs 108. It can be seen from the figure that, with this structure, when the eliminating grid voltage is 10 V, the floating gate voltage V(FG) equals $VDD/2$, in other words, the effect of parasitic substrate capacitance has been completely eliminated.

Due to other non-idealities in the semiconductor, it is not necessarily appropriate trying to achieve complete compensation of substrate capacitance by this method. In some non-critical applications, sufficient compensation can be accomplished by connecting the eliminating grid 107 to the operating voltage.

In v-MOSFET circuits, the non-idealities described in the preamble can also be cancelled by using a circuit as illustrated in FIG. 4. A cross-section of the structure implemented in this case is presented in FIG. 5. In addition to the main inputs 108, the structure comprises control grids 109 formed in the lower polysilicon layer. The order of the polysilicon layers relative to each other is of no importance as regards the invention; the essential point is that capacitive coupling is provided between the control grids 109 and the floating gate 102. In conjunction with the same structure, an eliminating grid 107 can also be used. Control voltages, which may be digital voltages, are applied to the control grids 109. For the control grids 109, it is possible to select weighting coefficients [] capacitances with e.g. binary weighting $C_i\ 2^{i-1}$ (i=1, 2, ..., n). In this case, by using n control grids 109, $n^2$ different base levels are obtained, regardless of the voltages at the main inputs 108.

FIG. 4a illustrates a simulation arrangement with three control grids 109 to which all possible states are connected in turn while a ramp voltage is applied to the main inputs 108. The number of control grids 109 required and their total capacitance are determined by the desired control accuracy and the technology used. In the example simulation, the ratio between the total coupling capacitance of the inputs 108 and the sum of the capacitances of the control grids 109 is 10/1. The smallest voltage change occurring at the floating gate 102 is obtained from the equation:

$$\Delta\phi_{F\min} = \frac{C_1^c V_{DD}}{\sum_{i=1}^{n} C_i + \sum_{j=1}^{m} C_j^c}$$

where the superscript c means control grid, n is the number of main inputs, $C^C_1$, is the lowest capacitance of the control grids and m is the number of control grids. The largest voltage change is obtained from the equation:

$$\Delta \phi_{F\max} = \frac{\sum_{j=1}^{m} C_j^c V_{DD}}{\sum_{i=1}^{n} C_i + \sum_{j=1}^{m} C_j^c}$$

In the above equations, substrate capacitance and the effect of a possible eliminating grid 107 are omitted.

This solution provides the advantage of allowing the use of digital control. A digital control signal can be generated within the microcircuit e.g. using a circuit as shown in FIG. 6. Using an accurate comparator and logic, a signal for controlling the control grids 109 is defined that will bring the output of the v-MOSFET circuit as close to the desired level as possible. With a control sequence generated, several v-MOSFET circuits can be controlled as the variations in process parameters between different parts of the same microcircuit are small. Thus, using this method, regulation of microcircuits containing many functions of similar nature, such as neural network circuits, can be implemented with a relatively small increase in surface area. As the price of microcircuits is directly proportional to area, considerable advantages are achieved for a small increase in price.

In an embodiment, corresponding digital control is implemented for an eliminating grid 107, in which case the eliminating grid 107 processed onto the floating gate 102 is divided into several sections, in which the control is implemented.

Non-idealities in v-MOSFET circuits can also be compensated by forming a conductive layer, e.g. an n-type basin 110 connected to a constant potential, below the floating gate 102. FIGS. 7a–b present a schematic view of a possible structure. Connected to the basin 110 via a contact 111 is a piece of conductor metal 112 to apply a constant potential to the basin 110. In this case, the potential of the floating gate 102 will be $$\phi_F = \frac{\sum_{i=1}^{n} C_i V_i + C_0 \cdot V_0}{\sum_{i=1}^{n} C_i + C_0}$$

where $\phi F$ is the floating gate voltage, $C_i$ is the weighting coefficient (capacitance) of input i, and $V_i$ is the voltage at input i. In the above equation, the potential of the conductor below the floating gate 102 and the weighting coefficient have the subscript 0. In typical IC technology, the capacitance ratio of an (actual) capacitor to be processed is typically 5–20. When an analogue control voltage ($V_a$) having a magnitude such that $V_{ss}<V_a<V_{DD}$ is used, the effects of process variations on MOSFET transistors can be almost completely eliminated. FIG. 8a presents a simulation diagram with typical transistor parameters, with a constant voltage, e.g. $V_{DD}/2$, applied to the main inputs and a ramp voltage applied to the controlling n-basin 110. In another simulation arrangement, the transistor parameters have been changed while keeping the same input voltages. From FIG. 8a it can be seen that, regardless of the transistor parameters, a control voltage is found that allows the desired output voltage to be achieved.

It is possible to implement digital control as described above for the lower basin 110 as well. In this case, the basin below the floating gate 102 is divided into several sections and a separate control potential is applied to each section.

The invention is not restricted to the examples of its embodiments described above, but many variations are possible within the scope of the inventive idea defined in the claims.

What is claimed is:

1. A semiconductor transistor structure comprising:
   a substrate for the semiconductor transistor structure;
   an active region of semiconducting material formed on the substrate, the active region having a source and a drain;
   at least one input for the semiconductor transistor structure;
   a floating gate having a first portion positioned with respect to the active region on the substrate to exert control of the current flow through the active region responsive to a voltage on the floating gate to form a field effect transistor, said floating gate having a second portion displaced away from the active region along the substrate, said second portion being capacitively coupled to said at least one input to provide the current controlling voltage on the floating gate; and
   a conductive layer positioned in the semiconductor structure so that the conductive layer is insulated from the floating gate and at least partially overlaps the second portion of the floating gate, the conductive layer minimizing or eliminating parasitic substrate capacitance in the operation of the semiconductor transistor structure when a constant potential is applied to the conductor layer.

2. Semiconductor transistor structure as defined in claim 1 characterised in that the semiconductor transistor structure is further defined as forming at least a portion of a neural network circuit.

3. Semiconductor transistor structure as defined in claim 1 comprising a plurality of inputs for the semiconductor transistor structure.

4. Semiconductor transistor structure as defined in claim 1, characterised in that it comprises an eliminating grid formed from the conductive layer and at least partially overlapping the second portion of said floating gate.

5. Semiconductor transistor structure as defined in claim 1, characterised in that it comprises a control grid insulated from the floating gate (102) and formed in the semiconductor transistor structure, said control grid being made of the same material as the at least one input and capacitively connected to the floating gate.

6. Semiconductor transistor structure as defined in claim 5, characterised in that the control grid is formed in a common layer with the at least one input.

7. Semiconductor transistor structure as defined in claim 1, characterised in that it comprises a basin formed from the conductive layer and disposed at least partially below the floating gate.

8. Semiconductor transistor structure as defined in claim 1, characterised in that the conductive layer is divided into at least two sections so that the potentials of different sections can be controlled independently of each other.

9. Semiconductor transistor structure as defined in claim 8, characterised in that the sections of said conductor layer are suitable for digital control.

10. Semiconductor transistor structure as defined in claim 8, characterised in that the relative proportions of the sections are formed in accordance with a binary weighting.

11. Semiconductor transistor structure as defined in claim 1, characterised in that the semiconductor transistor structure is further defined as forming at least a portion of an A/D converter.

12. Semiconductor transistor structure as defined in claim 1, characterised in that the semiconductor transistor structure is further defined as forming at least a portion of a digital logic gate.

13. Semiconductor transistor structure as defined in claim 1, characterised in that the semiconductor transistor structure is further defined as forming at least a portion of a D/A converter.

14. Semiconductor transistor structure as defined in claim 1, characterised in that the semiconductor transistor structure is further defined as forming at least a portion of a comparator.

15. A method for manufacturing a semiconductor transistor structure comprising the steps of:

providing a substrate for the semiconductor transistor structure;

forming an active region of semiconducting material on the substrate, the active region having a source and a drain;

providing at least one input for the semiconductor transistor structure;

positioning a first portion of a floating gate with respect to the active region to exert control of the current flow through the active region responsive to a voltage on the floating gate to form a field effect transistor;

capacitively coupling a second portion of the floating gate to the at least one input to provide the current controlling voltage on the floating gate, the second portion of the floating gate being displaced away from the active region along the substrate; and positioning a conductive layer in the semiconductor structure so that the conductive layer is insulated from the floating gate and at least partially overlaps the second portion of the floating gate, the conductive layer minimizing or eliminating parasitic substrate capacitance in the operation of the semiconductor transistor structure when a constant potential is applied to the conductive layer.

16. The method of claim 15 further defined as including the step of forming an eliminating grid in the conductive layer extending at least partially over the second portion of the floating gate.

17. The method of claim 15 further including the steps of forming a control grid of the same material as the at least one input in the semiconductor transistor structure and capacitively coupling the control grid to the floating gate.

18. The method of claim 17 further defined as forming the control grid in a common layer with the at least one input.

19. The method of claim 15 further defined as disposing a basin formed from the conductive layer at least partially under the floating gate.

20. The method of claim 15 wherein the step of positioning a conductive layer is further defined as positioning a conductive layer formed into at least two sections so that the potentials of different sections can be controlled independently of each other.

21. The method of claim 20 wherein the sections are further defined as suitable for being digitally controlled.

22. The method of claim 20 wherein the relative proportions of the sections are formed in accordance with a binary weighting.

23. The method of claim 15 further defined as providing a plurality of inputs for the semiconductor transistor structure.

* * * * *